(12) United States Patent
Chartarifsky et al.

(10) Patent No.: US 7,479,794 B2
(45) Date of Patent: Jan. 20, 2009

(54) SPRING LOADED PROBE PIN ASSEMBLY

(75) Inventors: Dov Chartarifsky, Chandler, AZ (US); Avi Pollak, Ra'anana, IL (US); Dan Mironescu, Yoqneam Elite, IL (US)

(73) Assignee: SV Probe Pte Ltd, Singapore (SG)

( * ) Notice: Subject to any disclaimer, the term of this patent is extended or adjusted under 35 U.S.C. 154(b) by 0 days.

(21) Appl. No.: 11/712,797

(22) Filed: Feb. 28, 2007

(65) Prior Publication Data
US 2008/0204061 A1  Aug. 28, 2008

(51) Int. Cl.
G01R 31/02 (2006.01)

(52) U.S. Cl. .................................. 324/754

(58) Field of Classification Search .......... 324/754–765
See application file for complete search history.

(56) References Cited

U.S. PATENT DOCUMENTS

| | | | |
|---|---|---|---|
| 3,274,534 A * | 9/1966 | Shortridge | 439/700 |
| 4,686,465 A * | 8/1987 | Kruger | 324/754 |
| 4,793,814 A * | 12/1988 | Zifcak et al. | 439/66 |
| 4,899,104 A * | 2/1990 | Maelzer et al. | 324/761 |
| 4,968,589 A * | 11/1990 | Perry | 430/314 |
| 5,244,396 A * | 9/1993 | Matsuoka | 439/72 |
| 5,324,205 A * | 6/1994 | Ahmad et al. | 439/66 |
| 6,407,565 B1 * | 6/2002 | Sayre et al. | 324/755 |
| 6,469,531 B1 * | 10/2002 | Sayre et al. | 324/755 |
| 6,642,728 B1 * | 11/2003 | Kudo et al. | 324/754 |
| 6,677,772 B1 * | 1/2004 | Faull | 324/761 |
| 6,685,492 B2 * | 2/2004 | Winter et al. | 439/219 |
| 6,844,749 B2 * | 1/2005 | Sinclair | 324/761 |
| 6,937,045 B2 * | 8/2005 | Sinclair | 324/761 |
| 6,992,496 B2 * | 1/2006 | Winter et al. | 324/755 |
| 7,040,902 B2 * | 5/2006 | Li | 439/66 |
| 7,202,677 B2 * | 4/2007 | Pedersen et al. | 324/754 |
| 2002/0113611 A1 * | 8/2002 | Goto et al. | 324/761 |
| 2003/0049974 A1 * | 3/2003 | Bauer et al. | 439/840 |
| 2004/0046581 A1 * | 3/2004 | Maekawa et al. | 324/755 |
| 2004/0100295 A1 * | 5/2004 | Lee | 324/761 |

* cited by examiner

*Primary Examiner*—Ha Tran T Nguyen
*Assistant Examiner*—Richard Isla Rodas
(74) *Attorney, Agent, or Firm*—Hickman Palermo Truong & Becker LLP

(57) ABSTRACT

A method and apparatus for constructing a probe card assembly is provided. A probe pin is inserted into an aperture of an inverted socket enclosure to cause a probe pin shoulder of the probe pin to make contact with an aperture shoulder of the aperture. An upper end of the probe pin protrudes from the aperture after the probe pin shoulder makes contact with the aperture shoulder. A compressible member is inserted into the aperture to position an upper end of the compressible member to make contact with a lower portion of the probe pin. A substrate is aligned over the inverted socket enclosure so that the lower end of the compressible member is in contact with a substrate contact located on the substrate. The substrate is affixed in a non-permanent manner to the inverted socket enclosure.

8 Claims, 6 Drawing Sheets

Section A-A

SPRING LOADED PROBE PIN ASSEMBLY

FIELD OF THE INVENTION

The present invention relates to an approach for creating a spring-loaded probe pin assembly.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

In the manufacture of certain probe cards and the like, each probe of the probe card is electroformed (e.g., as part of a group of probes), singulated, and then mechanically bonded (e.g., one at a time) onto the probe card. This process is time and resource intensive. Further, often it is necessary to perform additional work to realign any misaligned probes on the probe card before the probe card may be satisfactorily used in testing. Such rework may interfere with the bonds holding the probes to the probe card.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
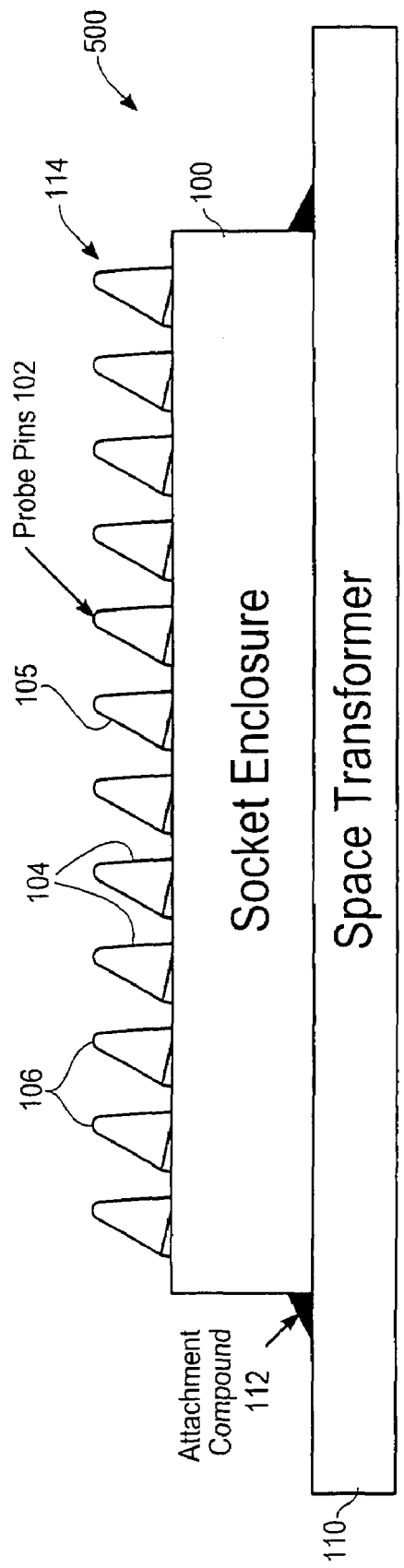
FIG. 1 is a side, sectional view of an assembly according to an embodiment of the invention.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Functional Overview

In an exemplary embodiment of the present invention, a socket with precisely formed apertures 400 is adapted to retain respective probe pin 102/compressible member 402 assemblies in precise alignment at desired lean angle(s) 120. The guidance provided to the probe pin 102/compressible member 402 assemblies by respective apertures 400 substantially reduces or eliminates the alignment problems associated with the convention probe cards regarding reworking. Assembly of exemplary probe card assembly 500 is also simplified as, in essence, probe pins 102 and compressible members 402 may just be dropped into respective apertures 400 of socket enclosure 100 and then space transformer/structure/substrate 110 may be attached to socket enclosure 100 to retain them therein. Further, in an exemplary embodiment, the space transformer/structure/substrate 110 is removably attached to socket enclosure 100 so that individual probe pins 102 and/or compressible members 402 may be replaced as needed to permit repair of the probe card assembly 500 while keeping the same multi-layer ceramic (MLC) structure. In an embodiment, compressible member 402 may be a resiliently compressible member (such as a spring or the like) that compresses in response to a force asserted against a probe pin in contact the resiliently compressible member.

Spring-Loaded Probe Pin Assembly

Figure 4:
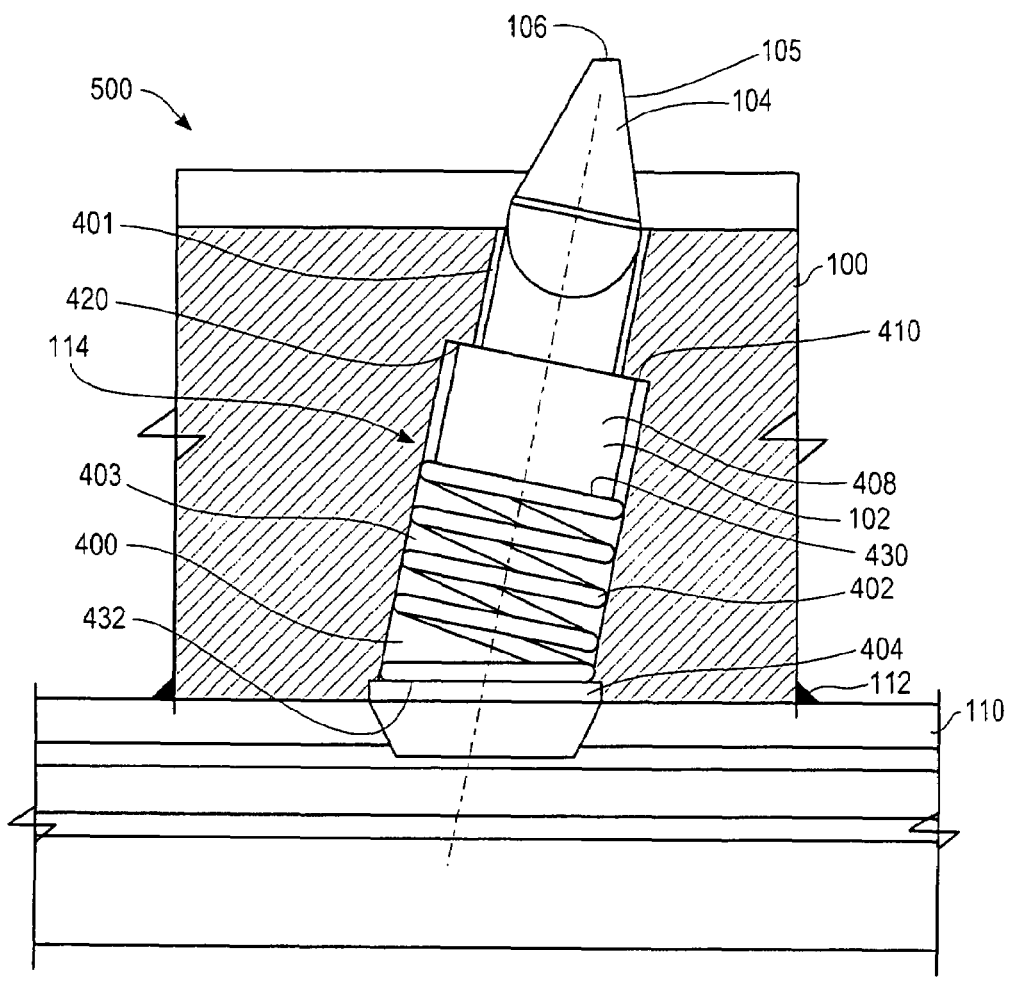
FIG. 4 is an enlarged side, sectional view of line A-A of FIG. 3 according to an embodiment of the invention.

FIG. 1 is a side, sectional view of an assembly in accordance with an embodiment of the invention. As illustrated in FIG. 1, socket enclosure 100 may have a plurality of conductors 114 slidingly within respective apertures 400 (as shown in FIG. 4) and may be affixed to structure 110 mechanically and/or by using attachment compound 112 (as depicted in FIG. 1). Non-limiting, illustrative approaches for mechanically affixing conductors 114 to structure 110 include the use of pins, bolts, screws, or the like. Structure 110 may be any type of structure, such as a space transformer (as depicted) or any type of substrate such as a printed circuit board (PCB), a multi-layered organic (MLO) substrate, or a multi-layered ceramic (MLC) substrate (see, for example, FIGS. 5 and 6).

In one embodiment, structure 110 may be removably attached to socket enclosure 100. In another exemplary embodiment, structure 110 may be permanently attached to socket enclosure 100. It is noted that if structure 110 is not permanently attached to socket enclosure 100, structure 110 and socket enclosure 100 may be separated so that individual conductors 114 (or individual pins 102 or compressible members 402) may be relatively easily be replaced or repaired to repair probe card assembly 500.

Figure 5:
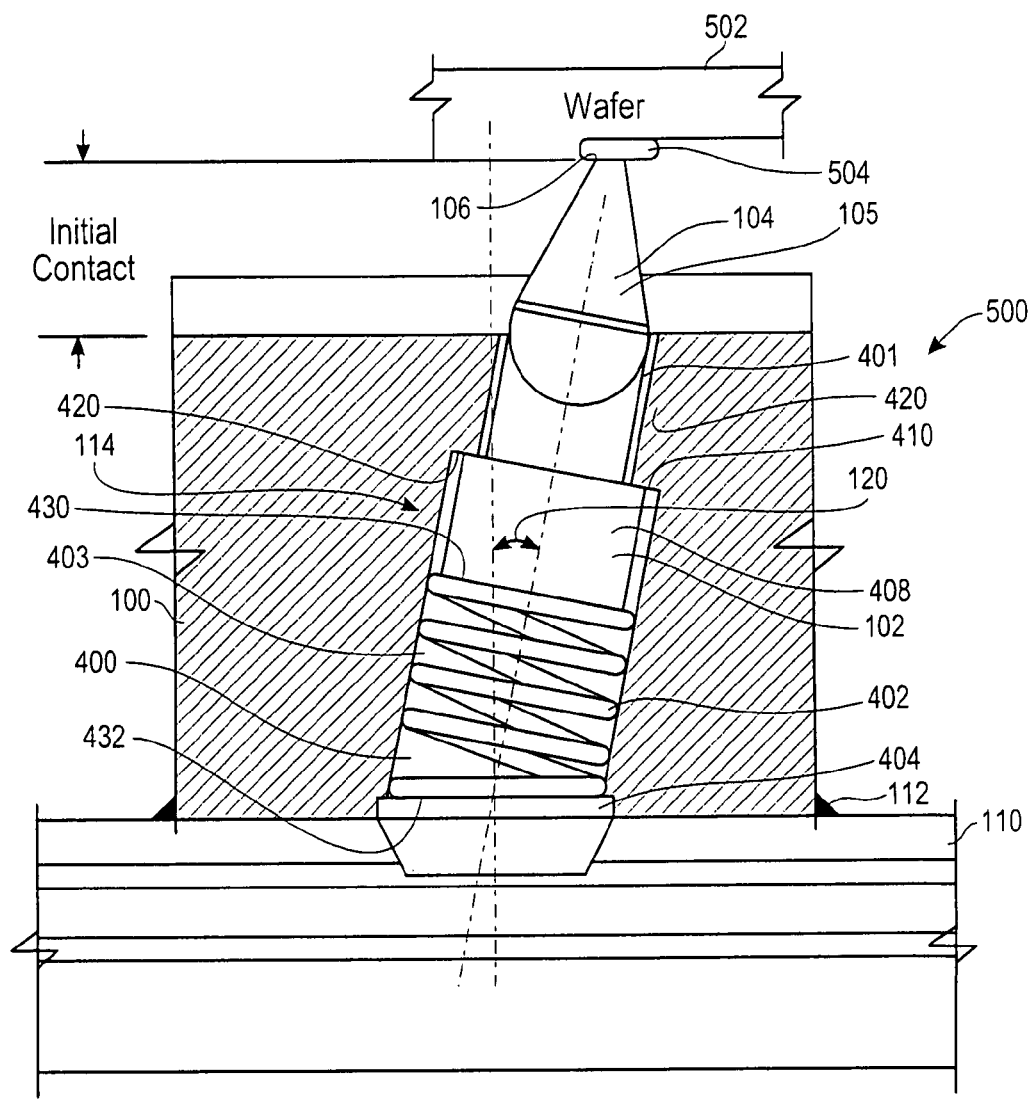
FIG. 5 is a further enlarged view of FIG. 4 further illustrating initial contact of a tip portion of a probe pin with a wafer according to an embodiment of the invention.

As shown in FIG. 1, the upper end 104 of probe pins 102 ends in tip portion 106. The upper end 104 of probe pins 102 may extend from apertures 400 (depicted in FIG.4) at a specified lean angle 120 (as shown in FIG. 5) relative to socket enclosure 100 and substrate 110. In an embodiment, lean angle 120 may be from about between 0° to 45°. According to certain embodiments of the invention, lean angle 120 may be between about 5° to 30°, and in other embodiments, lean angle 120 is between about 10° to 15°. Lean angle 120 may be selected in consideration of ensuring a sufficient or desired scrubbing action of tip portions 106 of probe pins 102 against upper circuit member contacts 504 (see FIG. 5).

The pattern of apertures and conductors 114 may be designed to mirror or match the pattern of upper circuit member contacts 504 with which probe card assembly 500 may be employed.

Socket enclosure 100 may be comprised of a non-conductive material such as a ceramic, e.g., zirconia alumina. For example, socket enclosure 100 may be comprised of a material so as to permit at least as little as a 150 micron spacing between adjacent apertures 400. It is noted that socket enclosure 100 may permit a pitch, i.e., socket enclosure 100 may allow adjacent apertures as close as, for example, of about 100 microns or closer.

Probe pins 102 may be comprised of an electrically conductive material such as nickel, stainless steel, copper manganese (CuMn), palladium (Pd) or alloys thereof and may further be coated with a conductive material, such as gold (Au).

In an embodiment of the invention that employs attachment compound 112, attachment compound 112 may be comprised of an adhesive compound such as, a glue-type material or epoxy. Whether attachment compound 112 (as illustrated in FIG. 1) is used and/or mechanical attachments are used to attach socket enclosure 100 to structure 110, such compounds or attachments may also be employed proximate the center of socket enclosure 100, which may account for the tendency of the socket enclosure 100 to separate from structure 110, especially at the center, due to the cumulative action and force of the compressible members 402 against structure 110 and contacts 432 (see FIG. 4).

Figure 2:
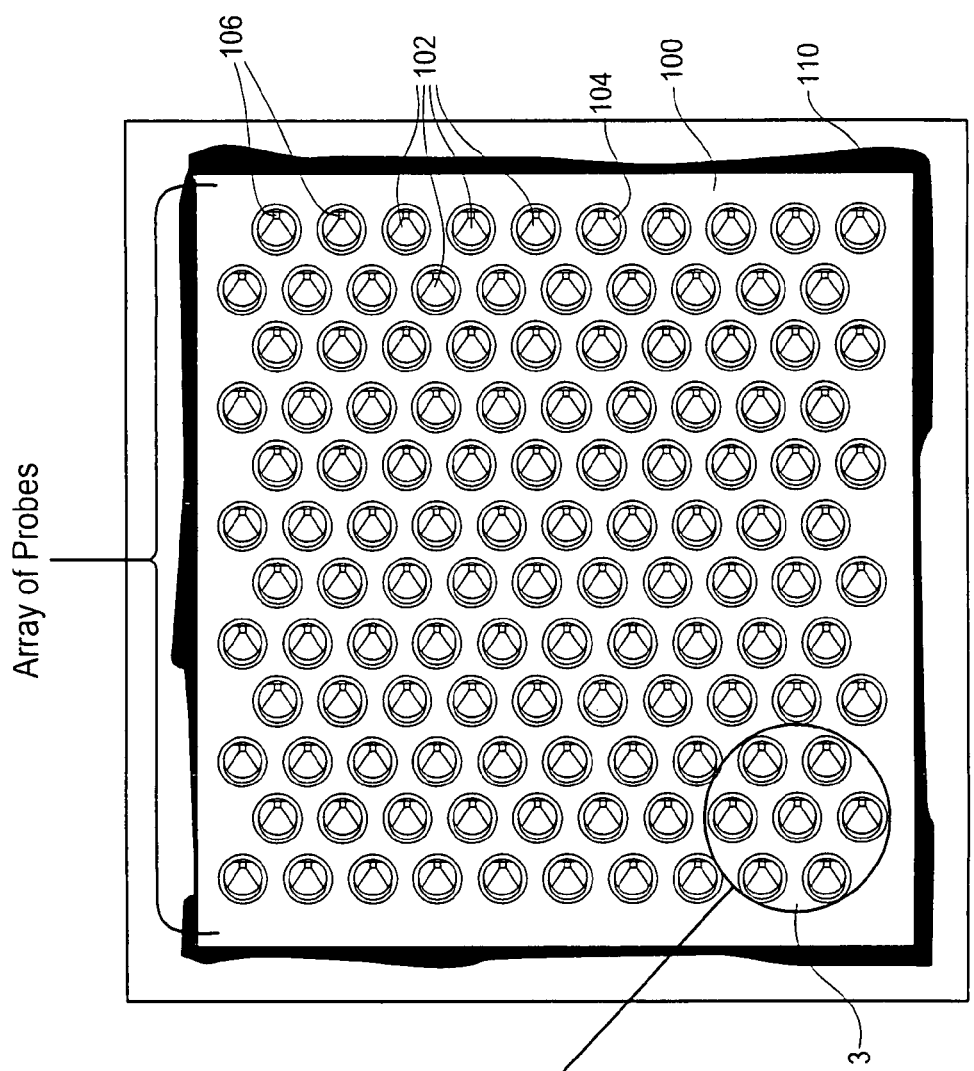
FIG. 2 is an overhead plan view of FIG. 1 according to an embodiment of the invention.

FIG. 2 depicts an overhead plan view of FIG. 1 according to an embodiment of the invention. As shown in FIG. 2, probe pins 102 may be disposed in an array within socket enclosure 100. While one hundred twenty (120) probe pins 102 are illustrated in FIG. 2, fewer or more probe pins 102 may be so disposed within socket enclosure 100 as desired. For example, in one exemplary embodiment of the present invention up to three thousand plus (3000+) compressible member (spring) loaded probe pins 102 may be employed in an array.

Figure 3:
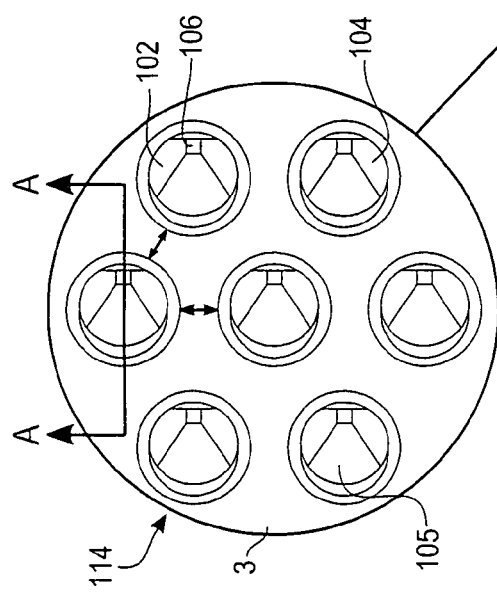
FIG. 3 is an enlarged view of the circled area of FIG. 2 according to an embodiment of the invention.

FIG. 3 depicts an enlarged view of FIG. 2 at circle "3" according to an embodiment of the invention. As shown in FIG. 3, each and every upper portion 104 of respective probe pins 102 may be disposed in an essentially identical fashion within apertures 400 and have essentially identical lean angles 120 (see FIG. 5 for example). Alternatively, certain probe pins 102 may be disposed in different orientations from one another.

FIG. 4 depicts a sectional view of FIG. 3 along line A-A according to an embodiment of the invention. As shown in FIG. 4, each conductor 114 may be slidingly received within aperture 400. Each conductor 114 may comprise an upper electrically conductive probe pin 102 and a lower electrically conductive compressible member 402. Probe pin 102 may include upper portion 104, and lower portion 408 having a greater diameter to define a shoulder 410. Probe pin 102 may be a unitary structure. Upper end 430 of compressible member 402 may contact lower portion 408 of probe pin 102. Lower portion 408 of probe pin 102 may simply rest on top of upper end 430 of compressible member 402 so that compressive member 402 may bias probe pin shoulder 410 against aperture shoulder 420 and maintain contact between probe pin 102 and compressible member 402. Alternatively, lower portion 408 of probe pin 102 may be affixed to upper end 430 of compressible member 402 using, for example, an electrically conductive glue or adhesive. Also, in addition to, or instead of, the use of an electrically conductive glue or adhesive, lower portion 408 of probe pin 102 may include a narrowed portion (not shown), at least a portion of which is adapted for receipt within upper end 430 of compressive member 402. In yet another exemplary embodiment, probe pin 102 and compressible member 402 may be a single, unitary structure.

As illustrated in FIGS. 2, 3 and 4, upper portions 104 of probe pins 102 may include shaped upper portion 105 terminating in tip portion 106. Tip portion 106 may be designed so as to facilitate electrical contact with upper circuit member contacts 504 (see FIG. 5 for example) and may facilitate a scrubbing motion against such upper circuit member contacts 504 (see FIGS. 5 and 6 for example) to remove or penetrate any layer overlying contacts 504 such as an oxide coating, for example. Shaped upper portion 105 may comprise a pyramidal shape as shown in FIG. 3 or FIG. 4 with a flat tip portion 106 designed to maximize scrubbing. Such a pyramidal shape has been discovered by the inventors to achieve a sharp enough tip portion 106 to maximize scrubbing while at the same time minimizing wear of probe pin 102. In another exemplary embodiment, tip portion 106 may be rounded. It is noted that probe pins 102 may be provided as a pre-existing item (for example from third parties) and may then be further processed to form pyramidal-shaped upper portion 105.

In an embodiment, compressible member 402 may comprise a spring, such as a torsion spring as illustrated in FIG. 4 or a number of other springs or the like. In another embodiment, compressible member 402 may comprise a series of interlaced conductive wires forming a lattice-like compressible member such as that disclosed in U.S. patent application Ser. No. 10/736,280, filed Dec. 15, 2003, which claims priority of U.S. provisional applications No. 60/457,076, filed Mar. 24, 2003, No. 60/457,258, filed Mar. 25, 2003, and No. 60/462,143, filed Apr. 8, 2003, each incorporated by reference in its entirety herein. As noted, the present invention is not limited, however, to depicted compressible member 402. Alternative self-supporting configurations may be employed, by other embodiments of the invention, such as a substantially cylindrical tube formed from a conductive mesh.

Compressible member 402 may be comprised of an electrically conductive material such as nickel, stainless steel, copper manganese (CuMn), palladium (Pd), or alloys thereof, and may further be coated with a conductive material, such as gold (Au).

As illustrated in FIG. 4, aperture 400 may be cylindrical with a lower portion 403 having a first diameter and an upper cylindrical portion 401 having a second diameter less than the lower portion's first diameter so as to define shoulder 420 and to receive upper portions 104 of respective probe pins 102. It is noted that aperture 400 may be sized to slidingly receive probe pin 102 and specifically, for example, first and second diameters of the aperture may be sized so as to slidingly receive respective lower portion 408 and upper portion 104 of probe pin 102 such that a gap may be maintained between aperture 400 and probe pin 102 except when probe pin shoulder 410 contacts aperture shoulder 420.

Lower end 432 of compressible member 402 may engage contact 404 on substrate 110 so as to bias probe pin 102 upwardly and specifically so as to maintain contact between probe pin shoulder 410 and aperture shoulder 420 absent a downward force against probe pin 102 sufficient to compress compressible member 402, and hence probe pin 102, downwardly. While the sizing of aperture 400 may be designed to maintain coaxial alignment of probe pin 102 and/or compressible member 402 within aperture 400, the spring tension also may also assist in maintaining such coaxial alignment.

Figure 7:
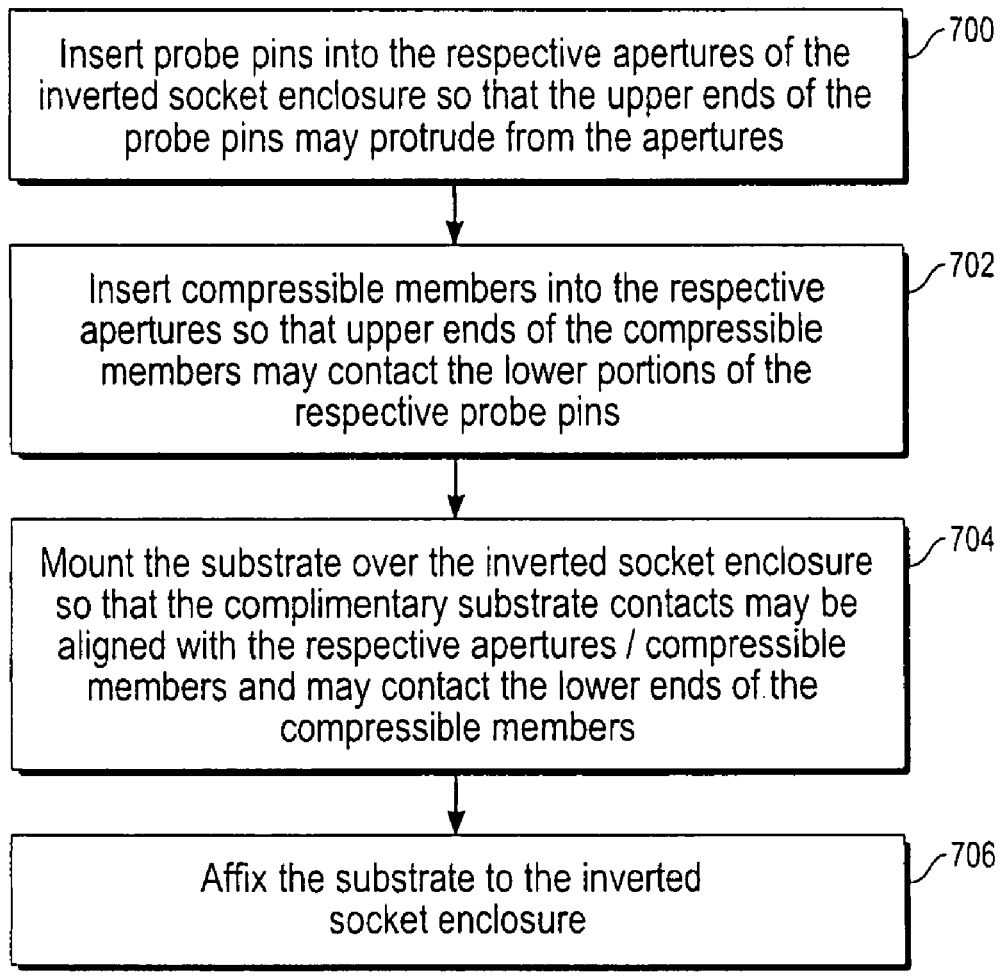
FIG. 7 is a flowchart illustrating a process of assembling a probe card assembly in accordance with an embodiment of the invention.

FIG. 7 is a flowchart illustrating a process of assembling a probe card assembly in accordance with an embodiment of the invention. FIG. 7 depicts an exemplary process. For example, certain of the steps in FIG. 7 may be eliminated or replaced by alternative steps. Likewise, the order of the steps may be rearranged in certain configurations of the invention.

In step 700, socket enclosure 100 may be inverted as compared to FIG. 1. Thereafter, probe pins 102 may be inserted into the respective socket enclosure apertures 400 so that probe pin shoulder 410 may contact aperture shoulder 420 and upper ends 104 of probe pins 102 may protrude from apertures 400.

In step 702, single compressible members 402 may then be inserted into respective apertures 400 so that upper ends 430 of compressible members 402 may contact lower portions 408 of respective probe pins 102.

In step 704, structure 110 may be aligned over inverted socket enclosure 100 so that complimentary substrate contacts 404 may be aligned with respective apertures 400 and/or compressible members 402. Structure 110 may be mounted to the socket enclosure so that lower ends 432 of compressible members 402 may contact the respective substrate contacts 404.

As discussed above, it is noted that the spring tension caused by the engagement between compressible member 402 and probe pin 102 and substrate contact 404: (1) may be used to assist in maintaining coaxial alignment of probe pin 102 and/or compressible member 402 with aperture 400; and (2) may be used to bias probe pin 102 against shoulder 420 of aperture 400.

In step 706, structure 110 may be affixed to inverted socket enclosure 100 such as by attachment compound 112, fasteners, etc. In an embodiment, structure 110 may not be permanently attached to socket enclosure 100 to facilitate repair of individual conductors 114 and/or individual probe pins 102 and /or individual compressible members 402. In another embodiment, structure 110 may be permanently attached to socket enclosure 100.

Figure 6:
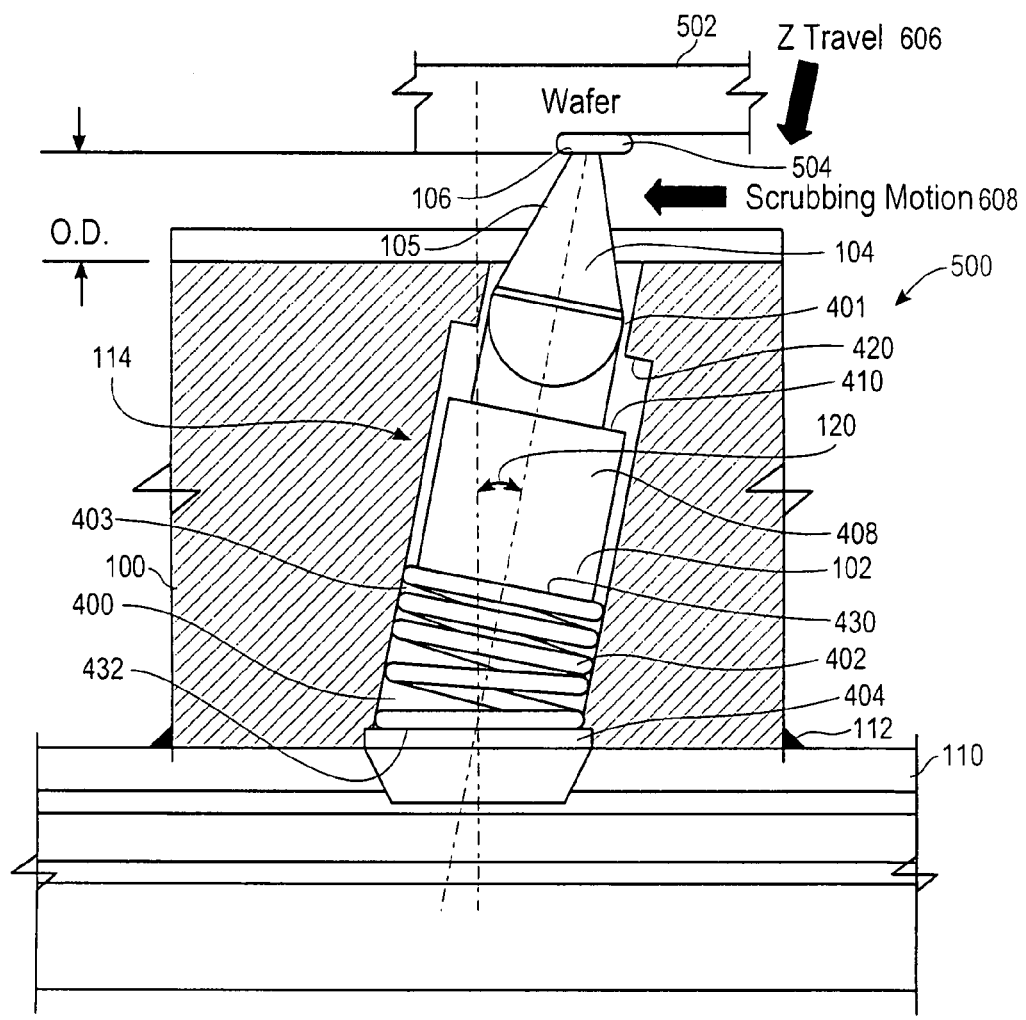
FIG. 6 is the structure of FIG. 5 in contact with the wafer at overdrive according to an embodiment of the invention.

FIGS. 5 and 6 illustrate the scrubbing motion achieved by conductor 114 when conductors 114 engage contacts 504 of upper circuit member 502 according to an embodiment. Upper circuit member 502 may be wafer 502 under test or a device under test (DUT).

As illustrated in FIG. 5, at Initial Contact, probe card assembly 500 may be positioned proximate upper circuit member 502 so that tip ends 106 of conductors 114 may just touch or contact respective upper circuit member contacts 504. Shoulder 410 of probe pin 102 may remain in contact with shoulder 420 of aperture 400.

As illustrated in FIG. 6, for example, probe card assembly 500 and upper circuit member 502 may be urged together so that upper circuit member contact 504 forces probe pin 102 downwardly (towards or to a maximum designed limit at the overdrive ("O.D.") position), compressing compressible member 402 to cause retraction of probe pin 102 within aperture 400. This angled "Z Travel" (over travel or overdrive) 606 of probe pin 102 may cause tip end 106 to horizontally scrub (leftwards as illustrated in FIGS. 5 and 6, for example) against upper circuit member contact 504 by "Scrubbing Motion" 608 to remove or penetrate any contaminate layer over contact 504, such as an oxide layer (not shown), to facilitate electrical contact between conductor 114 and contact 504. It is noted that in the exemplary embodiment illustrated in FIGS. 5-6, lean angle 120 remains substantially constant during Z Travel 606.

In an embodiment, the angle of Z Travel 606 may be from about greater than 0.0 (zero) to upwards of $^{10.0}/_{1000}$ inches. A large maximum Z Travel or overdrive 606 may help to ensure contact between probe pins 102 and respective contacts 504, but may also lead to a more rapid wear out of probe card assembly 500. In certain embodiments of the invention, a maximum Z Travel 606 may be from about $^{3.5}/_{1000}$ to $^{5.0}/_{1000}$ inches. Further, in certain embodiments of the invention, Z Travel 606 may be from about 0.0 (zero) to $^{2.0}/_{1000}$ inches. It is noted that with the improved planarity/co-planarity of probe pin tip ends 106 that is accomplished with the teachings of the present invention, smaller and smaller (maximum) Z Travel and/or overdrive 606 may be achieved while still permitting contact between probe pins 102 and respective contacts 504. While embodiments of the invention have been described with reference to a single touchdown, or contact, between conductors 114 and upper circuit member contacts 504, in practice multiple touchdowns may be employed during the testing of a single upper circuit member 504, such as a memory wafer.

By employing the present invention, a considerable amount of manufacturing process steps currently used to build a probe card assembly may be eliminated. Assembly in accordance with an exemplary embodiment of the present invention reduces to a few relatively simple process steps using well-know technologies, such as (1) EDM (electrical discharge machining) and the use of a shaped electrode with a high voltage discharge to remove material and achieve a desired shape without any mechanical touching and/or forming of the material to form probe pins 102, or (2) Auto-CNC (housing machining process, or an automated, sophisticated machining process) where a two-dimensional (2D) electronic drawing is inputted into a precise multi-axis grinding machine which converts the 2D drawing into a three-dimensional shaped structure from a template material, for example, metal or ceramic) to form socket enclosure 100 with spaced apertures 400 and/or probe pins 102, for example, with a high rate of accuracy and repeatability as compared to certain current assembly processes to form probes/probe card assemblies for wafer testing which are more involved, complex and time consuming. Thus, compared to certain conventional processes, cost, development time, and production cycle times may be reduced. Of course, these processes are exemplary in nature, and the present invention is not limited thereto.

In an embodiment of the invention, a socket enclosure may be employed which would enable not only exceptional probe tip alignment, with exceptional coplanarity of the respective probe tips throughout the entire array by providing directional guidance to the probe pin itself, but also substantially uniform scrubbing motion at most every touchdown, or contact, between the probe pin tip and the respective contact on the device under test (DUT). As noted above, this may also permit a lower maximum Z Travel and/or overdrive 606.

The exemplary embodiments of the present invention may enable a new generation of flip-chip wafer probe cards to support pad pitches, or space between adjacent pads, as low as at least, for example, about 150 microns.

While the present invention is described primarily with respect to spring-loaded probe pins configured at a lean angle, it is not limited thereto. For example, according to certain exemplary embodiments of the present invention, the spring-loaded probe pins may be provided orthogonal (or substantially orthogonal) to the surface of the underlying substrate (i.e., the substrate through which the spring-loaded probe pins are supported).

While the present invention has been described primarily with respect to probe cards for wafer testing of semiconductor devices, it is not limited thereto. Certain of the teachings may be applied to other technologies, for example, package testing of semiconductor devices.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A probe card assembly, comprising:
   a socket enclosure comprising a plurality of apertures, wherein said plurality of apertures includes an aperture at an angle of 5° to 45° from vertical; and
   a substrate that is temporarily affixed to said socket enclosure, wherein said substrate may be removed from said socket enclosure,
   wherein a resiliently compressible member and a probe pin are disposed within said aperture, an upper portion of said probe pin protrudes from the aperture, and the upper portion of said probe pin is pyramidal-shaped and includes a flat tip capable of providing scrubbing action when against a contact.

2. The probe card assembly of claim 1, wherein said aperture is at an angle of about 10° to 15° from vertical.

3. The probe card assembly of claim 1, wherein said resiliently compressible member allows said probe pin to slide within said aperture in response to force applied against said upper end of said probe pin.

4. The probe card assembly of claim 1, wherein said substrate is temporarily affixed to said socket enclosure using an adhesive compound.

5. The probe card assembly of claim 1, wherein said socket enclosure is made of a non-conductive material.

6. The probe card assembly of claim 1, wherein said probe pin is made of nickel, stainless steel, copper manganese, palladium or alloys thereof.

7. The probe card assembly of claim 6, wherein said probe pin is coated with gold.

8. The probe card assembly of claim 1, wherein said resiliently compressible member is a spring.

* * * * *

UNITED STATES PATENT AND TRADEMARK OFFICE
CERTIFICATE OF CORRECTION

PATENT NO. : 7,479,794 B2
APPLICATION NO. : 11/712797
DATED : January 20, 2009
INVENTOR(S) : Dov Chartarifsky et al.

It is certified that error appears in the above-identified patent and that said Letters Patent is hereby corrected as shown below:

Title Page, Item (75)
Inventors: delete "Avi Pollak, Ra'anana, IL (US)" and insert --Avi Pollak, Ra'anana, Israel--

Inventors: delete "Dan Mironescu, IL (US)" and insert --Dan Mironescu, Yoqneam Elite, Israel--

Signed and Sealed this

Twenty-ninth Day of September, 2009

David J. Kappos
*Director of the United States Patent and Trademark Office*